United States Patent
Su et al.

(10) Patent No.: US 7,369,424 B2
(45) Date of Patent: May 6, 2008

(54) PROGRAMMABLE MEMORY CELL AND OPERATION METHOD

(75) Inventors: Keng-Li Su, Hsinchu (TW); Shyh-Shyuan Sheu, Taichung (TW); Jan-Ruel Lin, Jhonghe (TW); Wei-Jen Chang, Tainan (TW); Chen-Pang Kung, Jhongli (TW)

(73) Assignee: Industrial Technology Research Institute, Hsinchu (TW)

( * ) Notice: Subject to any disclaimer, the term of this patent is extended or adjusted under 35 U.S.C. 154(b) by 95 days.

(21) Appl. No.: 11/271,550

(22) Filed: Nov. 9, 2005

(65) Prior Publication Data

US 2007/0103962 A1 May 10, 2007

(51) Int. Cl.
*G11C 11/00* (2006.01)
*G11C 11/14* (2006.01)

(52) U.S. Cl. ............... 365/148; 365/158; 365/171; 365/173

(58) Field of Classification Search ........... 365/148, 365/158, 171, 173, 174, 203
See application file for complete search history.

(56) References Cited

U.S. PATENT DOCUMENTS

| | | | |
|---|---|---|---|
| 5,153,680 A | 10/1992 | Naito et al. | 430/270.15 |
| 6,326,936 B1 | 12/2001 | Inganas et al. | 345/55 |
| 6,787,825 B1 | 9/2004 | Gudesen et al. | 257/278 |
| 6,791,885 B2 * | 9/2004 | Casper et al. | 365/203 |
| 6,838,720 B2 | 1/2005 | Krieger et al. | 257/296 |
| 6,873,538 B2 * | 3/2005 | Hush | 365/148 |
| 7,170,779 B2 * | 1/2007 | Miyawaki et al. | 365/174 |
| 7,205,564 B2 * | 4/2007 | Kajiyama | 365/158 |
| 2006/0198209 A1 * | 9/2006 | Tran | |

* cited by examiner

*Primary Examiner*—Trong Phan
(74) *Attorney, Agent, or Firm*—J.C. Patents

(57) ABSTRACT

A memory array including a plurality of programmable memory cells, a plurality of column lines and a plurality of row lines is introduced. Each of the programmable memory cells is coupled to corresponding one of the column lines and corresponding one of the row lines. Each of the programmable memory cells includes an organic memory cell and an active switching element. The active switching element is controlled by the column line and interposed between the row line and the organic memory cell. Under controlling of the column line, the active switching element is turned on to coupling the row line and the organic memory cell to connect to each other.

14 Claims, 5 Drawing Sheets

PROGRAMMABLE MEMORY CELL AND OPERATION METHOD

BACKGROUND OF THE INVENTION

1. Field of Invention

The present invention relates to a programmable memory cell, an operation method therewith. More particularly, the present invention relates to a programmable memory cell comprising an organic memory cell and an active switching element, and operation of the programmable memory cell therewith.

2. Description of Related Art

Organic devices made of organic materials have an advantage than silicon-based device, especially in characteristics of extension capability and flexibility. Organic materials can be laid down over almost any surface, and that makes it possible to form the organic memory arrays on a flexible plastic substrate, which soft electronic devices can be formed thereon. Organic materials can be made after the silicon processing has been completed, greatly simplifying the process. Organic materials are also compatible with metal electrodes since metals tend to be highly reactive with a variety of materials. Because of the simplicity of manufacturing process and bending characteristics, organic materials have became more and more important in the electronic products. In future, more and more printing manufacturing processes applications are developed for mass production of organic-material-based products, which significantly reduce manufacture costs of the organic devices.

Information storage applications are important techniques in the modern electronic techniques. The characteristics of resistance differentiation of the organic materials by applying a electric field can be used for forming the organic memory devices. The advantages of the organic memory devices includes bending tolerance and low cost of manufacture, which can be applied to the soft electronic devices and also become key elements for the system on flexible.

Please refer to FIG. 1, which shows a portion of a conventional organic memory device, which includes column lines C1 and C2, row lines R1 and R2, which are cross connected to each others through organic memory cells M11, M12, M21 and M22, each of which is interposed between the cross interconnection of one of the column lines and one of the row lines. In the organic memory device, a passive driving architecture is proposed, in which a bias voltage is applied to form the electric field in order to change the resistance of the passive organic memory cells. By applying such electric field, the resistance of the organic memory cell will be in a high resistance status or in a low resistance status. However, in such passive architecture, the applied electric field will influence the neighboring organic memory cells. Effect of electric field coupling will cause failure of the organic memory cells. It will restrict scaling down of the organic memory device, which is not adaptive to the large scaled integrated circuits.

SUMMARY OF THE INVENTION

The invention provides a memory array including a plurality of programmable memory cells, a plurality of column lines and a plurality of row lines. Each of the programmable memory cells includes an organic memory cell and an active switching element. By adding the active switching element, the organic memory cell is controlled to be applied with the bias voltage and the resistance of the organic memory cell can be used to store the information bit.

The proposed active driving architecture can avoid the influence on neighboring organic memory cells and also avoid the electric field coupling, which causes failure of the organic memory cells.

In order to the make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

As mentioned above, if an electric field is applied to organic materials, the resistance of the organic materials will change. Make use of such characteristics, the organic materials can be used as a programmable organic memory cell. An information bit can be written into the organic memory cell and also can be read out by applying suitable electric fields. Pleased refer to FIG. 2, if an information bit "1" is desired to be written into the organic memory cell, which is shown in the "Write 1" period of FIG. 2, a higher bias voltage is applied to the organic memory cell. As shown in the FIG. 2, if the bias voltage is lower than about 2.5 Volts (V), the resistance of the organic materials will change slowly and after the bias voltage is higher than about 2.5 V, the resistance of the organic materials is significantly reduced and conduct current of the organic memory cell is increased accordingly. The conduct current will be stably in a range of about $10\text{-}6 \sim 10^{-5}$ Ampere (A) even if the bias voltage is increased to 3~5 V or higher. The information bit "1" is successfully written into the organic memory cell because the resistance of the organic memory cell is in a status of low resistance. The relationship between the bias voltage and the conducted current is depicted as a curve "A", in which the bias voltage applied is shown in x-axis and the current is shown in y-axis.

Figure 1:
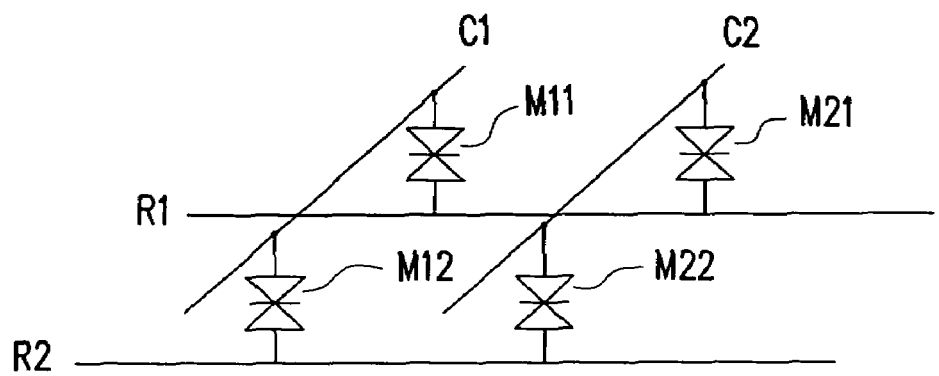
FIG. 1 shows a portion of a conventional organic memory device.
Figure 2:
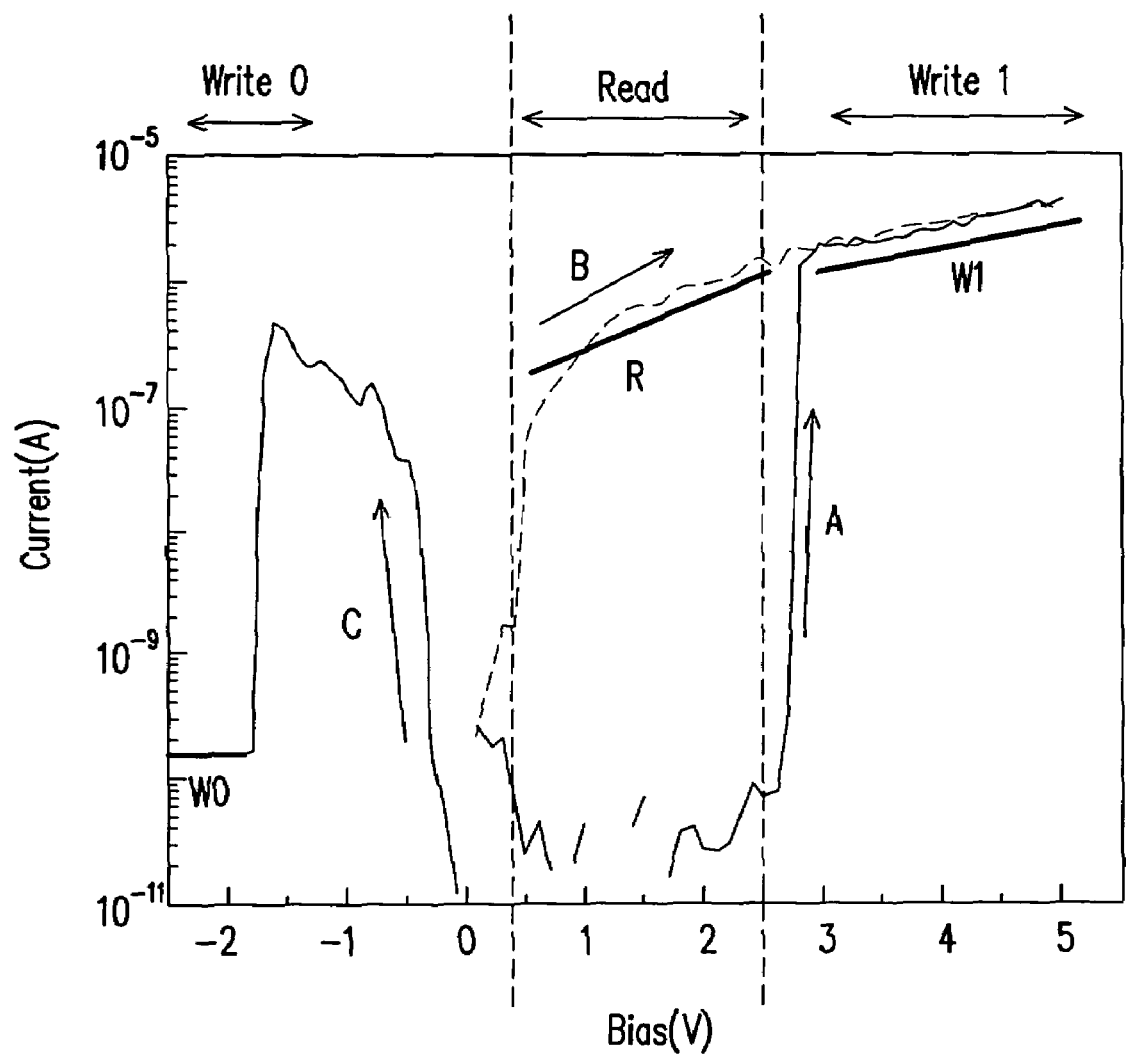
FIG. 2 shows a relationship between a bias voltage in x-axis and the conducted current in y-axis.

If information bit "0" is desired to be written into the organic memory cell, which is shown in the "Write 0" period of FIG. 2, a negative bias voltage is applied to the organic memory cell. As shown in the FIG. 2, when the bias voltage is applied, the resistance of the organic materials will change quickly and conduct current of the organic memory cell is increased significantly. After the bias voltage is lower than about −2 V, the conduct current of the organic memory cell will not change and is maintained in a stable status if the bias voltage is lower than −2 V or lower. The information bit "0" is successfully written into the organic memory cell because the resistance of the organic memory cell is in a status of high resistance. The relationship between the bias voltage and the conducted current is depicted as a curve "C".

If information bit written into the organic memory cell is desired to be read out, which is shown in the "Read" period of FIG. 2, a bias voltage applied to the organic memory cell is restricted to a reading range. As shown in the FIG. 2, the bias voltage for reading out the stored information bit is in a range from about 0.5-2.5 V, for example. If the bias voltage within the reading range is applied to the organic memory cell, the value of resistance of the organic memory cell can be read out, which represents the information bit is "0" or "1".

The invention provides a memory array including a plurality of programmable memory cells, a plurality of column lines and a plurality of row lines. Each of the programmable memory cells is coupled to corresponding one of the column lines and corresponding one of the row lines. Each of the programmable memory cells includes an organic memory cell and an active switching element. The active switching element is controlled by the column line and interposed between the row line and the organic memory cell. Under controlling of the column line, the active switching element is turned on to coupling the row line and the organic memory cell to connect to each other. By adding the active switching element, the organic memory cell is controlled to be applied with the bias voltage and the resistance of the organic memory cell can be used to store the information bit. The proposed active driving architecture can avoid the influence on neighboring organic memory cells and also avoid the electric field coupling, which causes failure of the organic memory cells.

Figure 3:
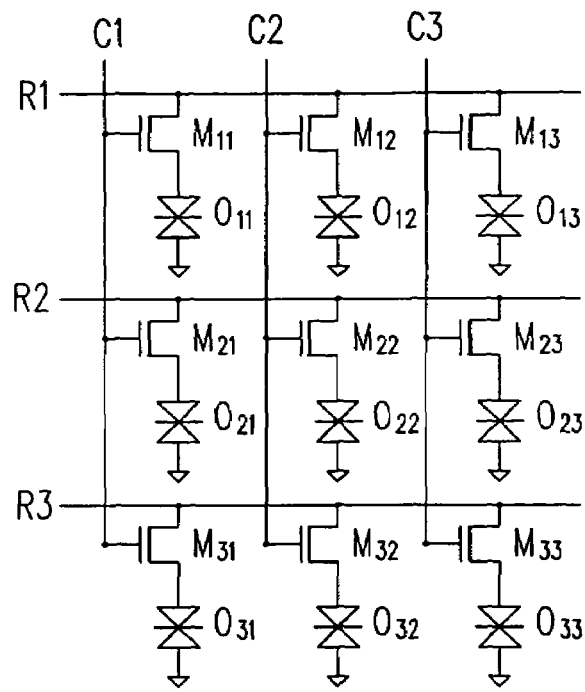
FIG. 3 shows a portion of a memory array of a preferred embodiment of the invention.

Please refer to FIG. 3, which shows a portion of a memory array of a preferred embodiment of the invention. In the memory array, column lines C1, C2 and C3 are cross connected to row lines R1, R2 and R3 through active switching elements, for example, transistors $M_{11}$, $M_{12}$, $M_{13}$, $M_{21}$, $M_{22}$, $M_{23}$, $M_{31}$, $M_{32}$ and $M_{33}$, each of which is interposed between the cross interconnection of one of the column lines and one of the row lines. In alternative embodiments, the transistors can be NMOS transistors or PMOS transistors, as desired. In the embodiment, NMOS transistors are provided for explanation, but not limited thereto. Each of these transistors is also connected to its corresponding organic memory cell, for example, the transistor $M_{11}$, $M_{12}$, $M_{13}$, $M_{21}$, $M_{22}$, $M_{23}$, $M_{31}$, $M_{32}$ or $M_{33}$ is respectively corresponding to the organic memory cell $O_{11}$, $O_{12}$, $O_{13}$, $O_{21}$, $O_{22}$, $O_{23}$, $O_{31}$, $O_{32}$ or $O_{33}$, as shown in FIG. 3. For example, transistor $M_{11}$ is interposed between the column line C1 and row line R1, and is also connected to the organic memory cell $O_{11}$. Each of the transistors has a gate terminal, a first source/drain terminal and a second source/drain terminal. The gate terminal is coupled to the corresponding column line, the first source/drain terminal is coupled to the corresponding row line, and the second source/drain terminal is coupled to the first terminal of the organic memory cell. For example, the transistor $M_{11}$ has a gate terminal coupled to the column line C1 and one of the source/drain terminals is coupled to the row line R1, and the other source/drain terminal is coupled to the organic memory cell $O_{11}$. The other terminal of the organic memory cell $O_{11}$ is connected to a ground electrode or a common electrode, according to design as desired. The common electrode is applied to a fixed direct current (DC) voltage source an alternating current (AC) source.

Figure 4A:
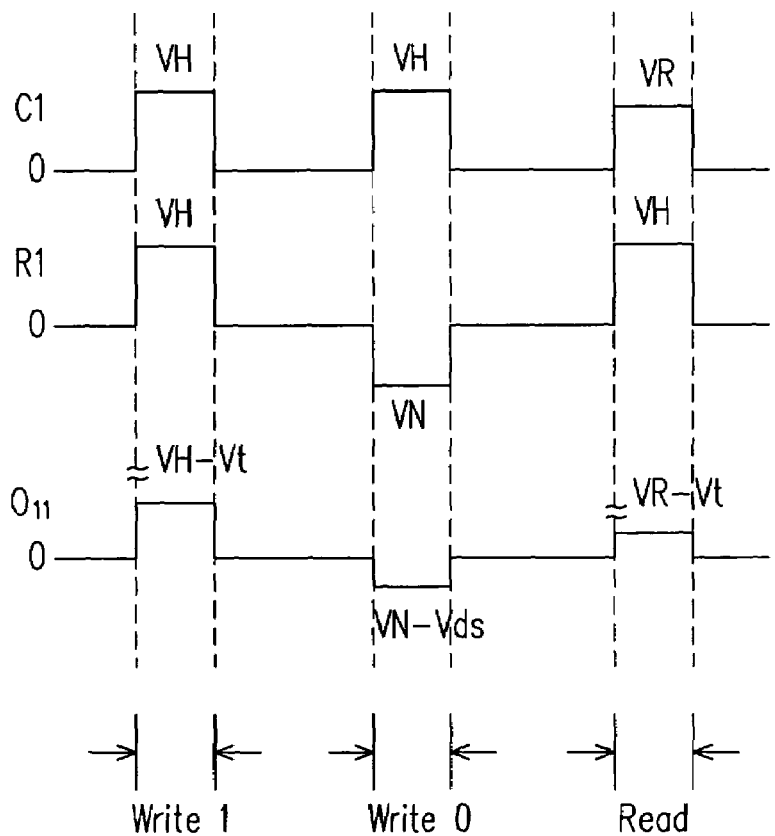
FIGS. 4A and 4B show an operation method of the organic memory cells accompanied with the transistors of FIG. 3.

One embodiment of the present invention of an operation method of organic memory cells accompanied with the transistors is introduced in FIG. 4A. The operation method includes writing "1" and writing "0" to and reading out from the organic memory cells, which are denoted as "Write 1 mode", "Write 0 mode" and "Read mode", respectively. For explanation, the operation of the organic memory cell $O_{11}$ is introduced as an example, but not limited thereto. As shown in FIG. 4A, voltages applied to the column line C1 are VH (a high voltage), 0 V and VR (a reading voltage), voltages applied to the row line R1 are VH (the high voltage), 0 V and VN (a negative voltage). The explanation is introduced as followed according to different operation modes shown in FIG. 4A.

When the Write 1 mode is performed, the column line C1 and the row line R1 are applied with the high voltage VH and the transistor $M_{11}$ is turned on. A bias voltage, which is equal to about VH-Vt, is applied to the organic memory cell $O_{11}$. The voltage Vt is the threshold voltage of the transistor $M_{11}$. After the bias voltage has been applied, the resistance of the organic memory cell $O_{11}$ is in a status of low resistance and the information bit "1" is successfully written into the organic memory cell $O_{11}$.

When the Write 0 mode is performed, the column line C1 is applied with the high voltage VH and the row line R1 is applied with a negative voltage VN and the transistor $M_{11}$ is turned on. A bias voltage, which is equal to about VN-Vds, is applied to the organic memory cell $O_{11}$. The voltage Vds is a voltage between the drain terminal to the source terminal of the of the transistor $M_{11}$. After the bias voltage has been applied, the resistance of the organic memory cell $O_{11}$ is in a status of high resistance and the information bit "0" is successfully written into the organic memory cell $O_{11}$.

When the Read mode is performed, the column line C1 is applied with the reading voltage VR and the row line R1 is applied with the high voltage VH and the transistor M1 is turned on in the beginning. A bias voltage, which is equal to about VR-Vt, is applied to the organic memory cell $O_{11}$. The voltage Vt is the threshold voltage of the transistor $M_{11}$. After the bias voltage has been applied, a current is flow out from the organic memory cell $O_{11}$ to the row line R1, which can be determined that the resistance of the organic memory cell $O_{11}$ is in a status of high or low resistance, which respectively represents the information bit "0" or the information bit "1" written into the organic memory cell $O_{11}$.

Figure 4B:
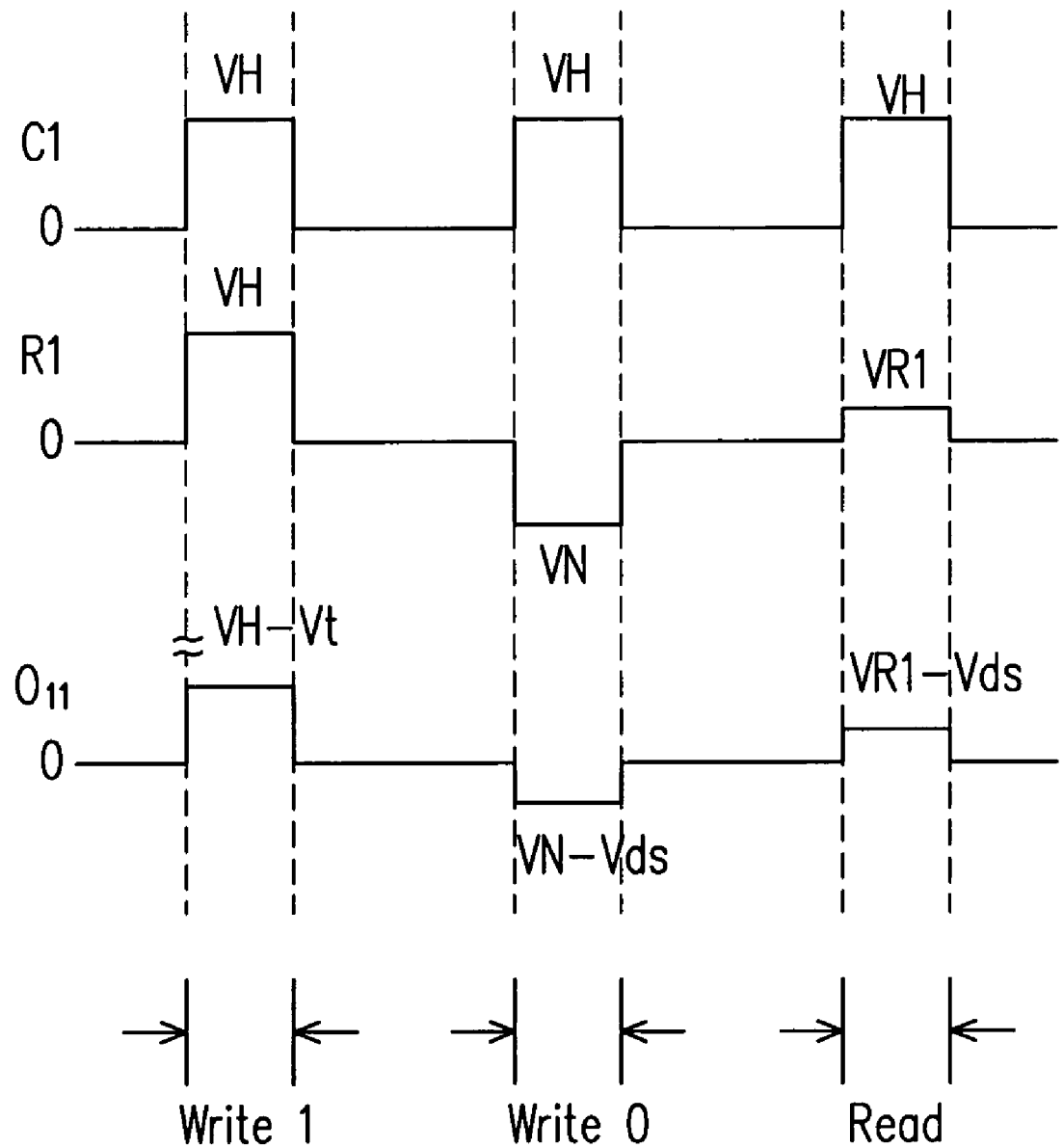

Another alternative embodiment of the present invention of operating organic memory cells accompanied with the transistors is introduced in FIG. 4B. The operation method includes writing "1" and writing "0" to and reading out from the organic memory cells, which are denoted as "Write 1 mode", "Write 0 mode" and "Read mode", respectively. For explanation, the operation of the organic memory cell $O_{11}$ of FIG. 3 is introduced as an example, but not limited thereto. The "Write 1 mode" and the "Write 0 mode" are the same as shown in FIG. 4A, which is referenced to the description above.

However, in the "Read mode" shown in FIG. 4B, the column line C1 is maintained in the high voltage VH, and the row line R1 is applied with applied with a reading voltage VR1 and the transistor $M_{11}$ is turned on in the beginning. A bias voltage, which is equal to about VR-Vds, is applied to the organic memory cell $O_{11}$. The voltage Vds is a voltage different between the drain and the source of the transistor $M_{11}$. After the bias voltage has been applied, a current is flow out from the organic memory cell $O_{11}$ to the row line R1, which can be determined that the resistance of the organic memory cell $O_{11}$ is in a status of high or low resistance, which respectively represents the information bit "0" or the information bit "1" written into the organic memory cell $O_{11}$.

Figure 5:
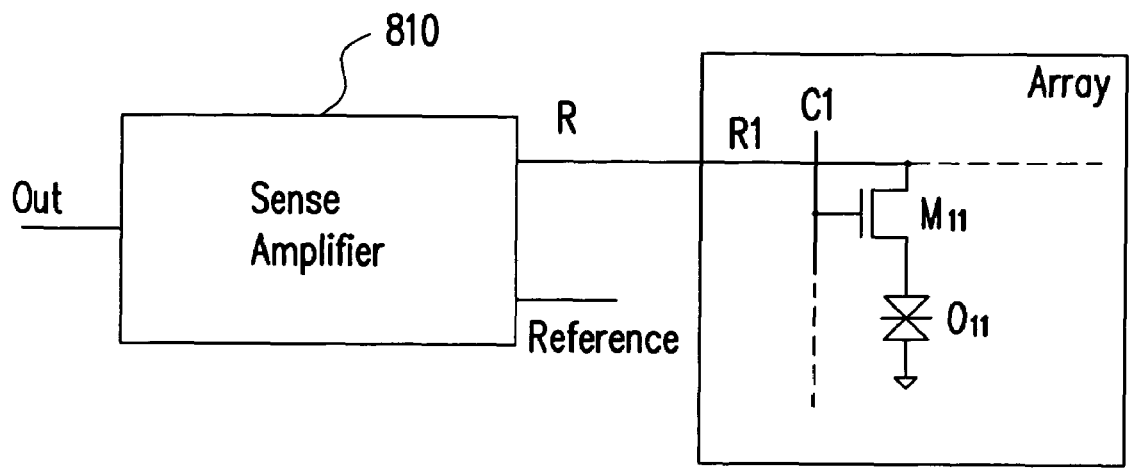
FIG. 5 shows a sense amplifier which sense the current flowing out from the organic memory cell $O_{11}$ of FIG. 3 to determine the information bit stored in the organic memory cell $O_{11}$.

Please refer to FIG. 5, the current flowing out from the organic memory cell $O_{11}$ to the row line R1 can be coupled to a sense amplifier 810. The sense amplifier 810, based on the reference, can determine the information bit stored in the organic memory cell $O_{11}$.

In the operation method of the organic memory device of the preferred embodiment of the invention, the voltages applied to the row line R1 are the high voltage VH, 0 V and a negative voltage VN. In the Read mode, instead of changing the voltage applied to the row line R1, the reading voltage VR is applied to the column line C1 in the embodiment. For example, if the VH is 12V and VR is 8V, and the threshold voltage of the transistor $M_{11}$ is 6V, the bias voltage applied to the organic memory cell $O_{11}$ is equal to about VR-Vt=8-6=2V, which is within the reading range of the organic memory cell.

In an alternative embodiment, the row line R1 can be applied with another voltage level other than the high voltage VH, 0 V and the negative voltage VN for reading operation and the voltage to turn on the transistor $M_{11}$ is still maintained at the high voltage VH. However, the former architecture is much easier rather than the later which applying another voltage to the row line R1 for reading operation.

Figure 6:
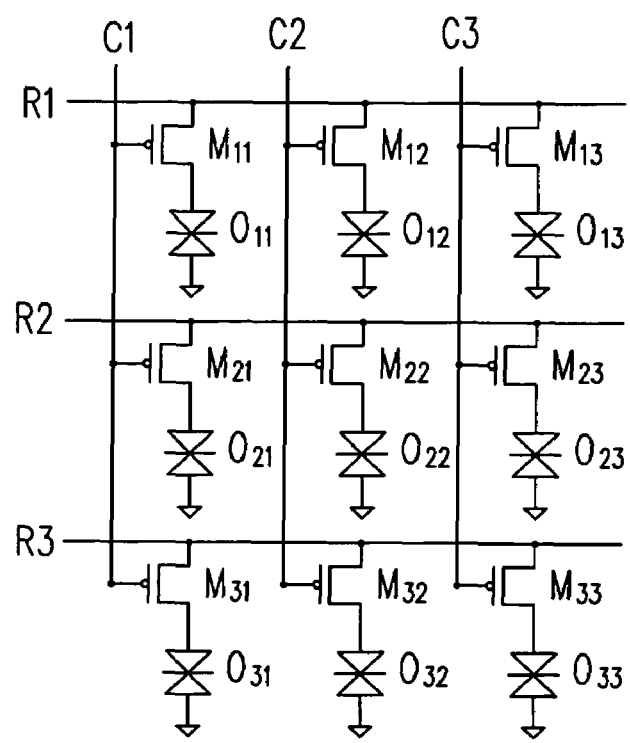
FIG. 6, which shows a portion of a memory array of another embodiment of the invention.

In another embodiment, please refer to FIG. 6, which shows a portion of a memory array of a preferred embodiment of the invention. In the memory array, column lines C1, C2 and C3 are cross connected to row lines R1, R2 and R3 through active switching elements, for example, transistors $M_{11}$, $M_{12}$, $M_{13}$, $M_{21}$, $M_{22}$, $M_{23}$, $M_{31}$, $M_{32}$ and $M_{33}$, each of which is interposed between the cross interconnection of one of the column lines and one of the row lines. In the embodiment, the transistors are PMOS transistors. Each of the transistors, for example, $M_{11}$, $M_{12}$, $M_{13}$, $M_{21}$, $M_{22}$, $M_{23}$, $M_{31}$, $M_{32}$ or $M_{33}$ is respectively connected to the corresponding organic memory cell $O_{11}$, $O_{12}$, $O_{13}$, $O_{21}$, $O_{22}$, $O_{23}$, $O_{31}$, $O_{32}$ or $O_{33}$, as shown in FIG. 6 The other terminal of each of the organic memory cells is connected to a ground electrode or a common electrode, according to design as desired. The common electrode is applied to a fixed direct current (DC) voltage source an alternating current (AC) source.

Figure 7:
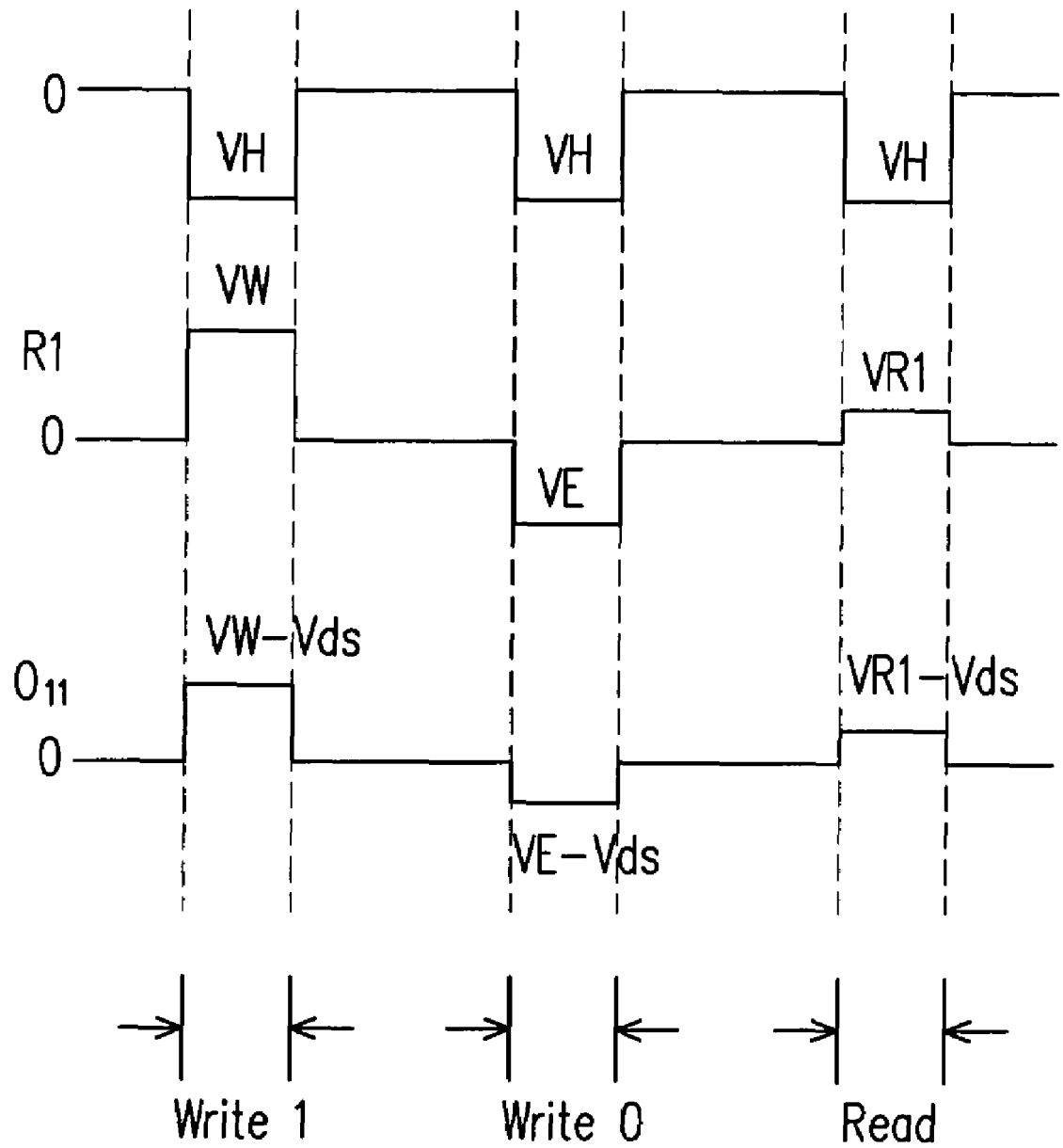
FIG. 7 shows an operation method of the organic memory cells accompanied with the transistors of FIG. 6.

An embodiment of an operation method of organic memory cells accompanied with the transistors of FIG. 6 is introduced in FIG. 7. The operation method includes writing "1" and writing "0" to and reading out from the organic memory cells, which are denoted as "Write 1 mode", "Write 0 mode" and "Read mode", respectively. For explanation, the operation of the organic memory cell $O_{11}$ of FIG. 6 is introduced as an example, but not limited thereto.

When the Write 1 mode is performed, the column line C1 is applied with a negative high voltage -VH and the row line R1 is applied with a write voltage VW, the transistor $M_{11}$ is turned on. A bias voltage, which is equal to about VW-Vds, is applied to the organic memory cell $O_{11}$. The voltage Vds is a voltage different between the drain and the source of the transistor $M_{11}$. After the bias voltage has been applied, the resistance of the organic memory cell $O_{11}$ is in a status of low resistance and the information bit "1" is successfully written into the organic memory cell $O_{11}$.

When the Write 0 mode is performed, the column line C1 is still applied with the negative high voltage -VH and the row line R1 is applied with a negative voltage VE and the transistor $M_{11}$ is turned on. A bias voltage, which is equal to about VE-Vds, is applied to the organic memory cell $O_{11}$. After the bias voltage has been applied, the resistance of the organic memory cell $O_{11}$ is in a status of high resistance and the information bit "0" is successfully written into the organic memory cell $O_{11}$.

When the Read mode is performed, the column line C1 is still applied with the negative high voltage -VH and the row line R1 is applied with a read voltage VR1, and the transistor $M_{11}$ is turned on in the beginning. A bias voltage, which is equal to about VR-Vds, is applied to the organic memory cell $O_{11}$. After the bias voltage has been applied, a current is flow out from the organic memory cell $O_{11}$ to the row line R1, which can be determined that the resistance of the organic memory cell $O_{11}$ is in a status of high or low resistance, which respectively represents the information bit "0" or the information bit "1" written into the organic memory cell $O_{11}$.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A programmable memory cell, comprising:
an organic memory cell, for storing a plurality of corresponding information bits, wherein the organic memory cell coupled to a common electrode; and
a switching element, coupled to the organic memory cell other than the terminal coupled to the common electrode, the information bit of the organic memory cell is programmed or read out by controlling the switching element;
wherein when the organic memory cell is programmed to store a logic high status for the information bit, the organic memory cell is charged to a logic high voltage level through the switching element; when the organic memory cell is programmed to store a logic low status for the information bit, the organic memory cell is discharged to a logic low voltage level through the switching element; and when the information bit stored in the organic memory cell is read out for use, the organic memory cell is charged to a reading voltage level within a reading range through the switching element; the logic high voltage level is a positive voltage level, the logic low voltage level is a negative voltage level, and the reading voltage level is between the logic high voltage level and the low high voltage level.

2. The programmable memory device of claim 1, wherein the switching element is a transistor in response to a column signal and in response to a row signal to program or read out the information bit stored in the organic memory cell.

3. The programmable memory device of claim 1, wherein the logic high voltage level is a voltage level which subtracts a first predetermine voltage level from a voltage level at a gate terminal of the transistor.

4. The programmable memory device of claim 3, wherein if the transistor is a NMOS transistor, the first predetermine voltage level is a threshold voltage level of the transistor.

5. The programmable memory device of claim 3, wherein if the transistor is a PMOS transistor, the first predetermine voltage level is a voltage difference between a drain terminal of the transistor and a source terminal of the transistor.

6. The programmable memory device of claim 1, wherein the logic low voltage level is a voltage level which adds a second predetermine voltage level to a voltage level at a gate terminal of the transistor.

7. The programmable memory device of claim 6, the second predetermine voltage level is a voltage difference between a drain terminal of the transistor and a source terminal of the transistor.

8. An operation method applied to an organic memory cell, the organic memory cell is programmed or read out by controlling a switching element connected thereto, the operation method comprising:
  programming the organic memory cell by applying a column signal and a row signal to the switching element to store an information bit in the organic memory cell;
  charging the organic memory to a logic high voltage level through the switching element when the organic memory cell is programmed to store a logic high status for the information bit;
  discharging the organic memory to a logic low voltage level through the switching element when the organic memory cell is programmed to store a logic low status for the information bit; and
  charging the organic memory cell to a reading voltage level within a reading range through the switching element when the information bit stored in the organic memory cell is read out for use; the logic high voltage level is a positive voltage level, the logic low voltage level is a negative voltage level, and the reading voltage level is between the logic high voltage level and the low high voltage level.

9. The operation method of claim 8, wherein the switching element is a transistor in response to the column signal and in response to the row signal to program or read out the information bit stored in the organic memory cell.

10. The operation method of claim 8, wherein the logic high voltage level is a voltage level which subtracts a first predetermine voltage level from a voltage level at a gate terminal of the transistor.

11. The operation method of claim 10, wherein if the transistor is a NMOS transistor, the first predetermine voltage level is a threshold voltage level of the transistor.

12. The operation method of claim 10, wherein if the transistor is a PMOS transistor, the first predetermine voltage level is a voltage difference between a drain terminal of the transistor and a source terminal of the transistor.

13. The operation method of claim 8, wherein the logic low voltage level is a voltage level which adds a second predetermine voltage level to a voltage level at a gate terminal of the transistor.

14. The operation method of claim 13, the second predetermine voltage level is a voltage difference between a drain terminal of the transistor and a source terminal of the transistor.

* * * * *